(12) United States Patent
Ye

(10) Patent No.: US 10,937,983 B2
(45) Date of Patent: Mar. 2, 2021

(54) ORGANIC ELECTROLUMINESCENT DEVICE AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Shiqian Ye, Hubei (CN)

(*) Notice: Subject to any disclaimer, the term of this patent is extended or adjusted under 35 U.S.C. 154(b) by 24 days.

(21) Appl. No.: 16/609,221

(22) PCT Filed: Jul. 12, 2019

(86) PCT No.: PCT/CN2019/095808
§ 371 (c)(1),
(2) Date: Oct. 29, 2019

(87) PCT Pub. No.: WO2020/258395
PCT Pub. Date: Dec. 30, 2020

(65) Prior Publication Data
US 2020/0411789 A1 Dec. 31, 2020

(30) Foreign Application Priority Data
Jun. 28, 2019 (CN) .......................... 201910573603.3

(51) Int. Cl.
H01L 51/50 (2006.01)
H01L 27/32 (2006.01)
H01L 51/52 (2006.01)

(52) U.S. Cl.
CPC ........ *H01L 51/5036* (2013.01); *H01L 27/326* (2013.01); *H01L 51/5056* (2013.01); *H01L 51/5072* (2013.01); *H01L 51/5096* (2013.01); *H01L 51/5206* (2013.01); *H01L 51/5221* (2013.01)

(58) Field of Classification Search
CPC ............ H01L 51/5036; H01L 51/5096; H01L 27/326; H01L 51/5221; H01L 51/5056; H01L 51/5206; H01L 51/5072
See application file for complete search history.

(56) References Cited

U.S. PATENT DOCUMENTS 9,281,487 B2 * 3/2016 Kim .................... H01L 51/5044
2009/0026921 A1 * 1/2009 Kuma ................. H01L 51/5265
313/504
2014/0209870 A1 7/2014 Shim et al.
(Continued)

FOREIGN PATENT DOCUMENTS

CN 104091895 A 10/2014
CN 104600199 A 5/2015
(Continued)

*Primary Examiner* — Victor A Mandala

(57) ABSTRACT

The invention discloses an organic electroluminescent device and a display panel. The organic electroluminescent device includes: a first electron blocking layer and a first light emitting layer in a first pixel region, a first electron blocking layer, a first light emitting layer, a second electron blocking layer, and a second light emitting layer in a second pixel region, and a first electron blocking layer, a first light emitting layer, a second electron blocking layer, a second light emitting layer, a third electron blocking layer, and a third light emitting layer in the third pixel region.

17 Claims, 4 Drawing Sheets

(56) References Cited

U.S. PATENT DOCUMENTS

| | | | |
|---|---|---|---|
| 2017/0154931 A1* | 6/2017 | Yoo | H01L 51/5218 |
| 2018/0061896 A1 | 3/2018 | Cheng et al. | |
| 2018/0151819 A1* | 5/2018 | Kim | H01L 27/3211 |
| 2018/0175118 A1* | 6/2018 | Toyoda | H01L 51/5275 |
| 2019/0372060 A1* | 12/2019 | Li | H01L 51/5096 |
| 2020/0259125 A1* | 8/2020 | Tseng | H01L 51/5056 |
| 2020/0343457 A1* | 10/2020 | Weaver | H01L 51/0072 |
| 2020/0373360 A1* | 11/2020 | Hack | H01L 51/5012 |

FOREIGN PATENT DOCUMENTS

| | | | |
|---|---|---|---|
| CN | 107256879 A | 10/2017 | |
| CN | 108598134 A | 9/2018 | |
| CN | 108878495 A | 11/2018 | |

* cited by examiner

ORGANIC ELECTROLUMINESCENT DEVICE AND DISPLAY PANEL

BACKGROUND OF INVENTION

Field of Invention

The present invention relates to the field of display panel technologies, and in particular, to an organic electroluminescent device and a display panel.

Description of Prior Art

Organic electroluminescent diodes (OLEDs) are becoming a new generation of display devices that gradually replace liquid crystal displays (LCDs) because of their self-illumination, wide color gamut, fast response times, high contrast, low power consumption, and simple fabricating processes. In recent years, with the progressive application of organic electroluminescent diodes in televisions, mobile phones, and so on, the research and production of organic electroluminescent diodes has become a hot spot in the optoelectronic industry.

The organic electroluminescent diode is formed by coating a thin film transistor (TFT) array substrate to form an organic material that can emit light independently, which is controlled by the TFT switch to achieve the purpose of controlling the sub-pixel to emit light independently. At present, the organic material coating methods mainly include inkjet printing (IJP) and vacuum evaporation, and the more mature one is a vacuum evaporation process using a fine metal mask (FMM). Due to a high precision requirement, a complicated preparation process, and easy drooping of the fine metal mask, defects generated in the vacuum evaporation process increase with an increase in a number of uses of the high-definition metal mask.

As shown in FIG. 1, the organic electroluminescent diode of the prior art includes an anode conductive layer 1, a cathode conductive layer 8, and a first pixel unit, a second pixel unit, and a third pixel unit disposed between the anode conductive layer 1 and the cathode conductive layer 8, wherein an electron blocking layer 2 and an light-emitting layer 3 in the first pixel unit, an electron blocking layer 4 and an light-emitting layer 5 in the second pixel unit, and an electron blocking layer 6 and an light-emitting layer 7 in the third pixel unit have smaller structure areas and need to be prepared by using the fine metal mask, resulting in a increased number of fine metal masks in the preparation process of the organic electroluminescent diode, thereby increasing the defect rate of the organic electroluminescent diode.

SUMMARY OF INVENTION

An embodiment of the present invention provides an organic electroluminescent device and a display panel to solve the problem of high defect rate of the existing organic electroluminescent device.

An embodiment of the present invention provides an organic electroluminescent device, including: an anode conductive layer; an organic functional layer disposed on the anode conductive layer; a cathode conductive layer disposed on the organic functional layer, wherein the organic functional layer includes a first pixel region, a second pixel region, and a third pixel region; and wherein the organic functional layer in the first pixel region includes a first electron blocking layer and a first light-emitting layer which are sequentially disposed on a side of the anode conductive layer adjacent to the cathode conductive layer, the organic functional layer in the second pixel region includes the first electron blocking layer, the first light-emitting layer, a second electron blocking layer, and a second light-emitting layer which are sequentially disposed on the side of the anode conductive layer adjacent to the cathode conductive layer, and the organic functional layer in the third pixel region includes the first electron blocking layer, the first light-emitting layer, the second electron blocking layer, the second light-emitting layer, a third electron blocking layer, and a third light-emitting layer which are sequentially disposed on the side of the anode conductive layer adjacent to the cathode conductive layer.

Further, the second electron blocking layers in the second pixel region and the third pixel region are disposed in a same layer, and the second light-emitting layers in the second pixel region and the third pixel region are disposed in a same layer.

Further, the first electron blocking layers in the first pixel region, the second pixel region, and the third pixel region are disposed in a same layer, and the first light-emitting layers in the first pixel region, the second pixel region, and the third pixel region are disposed in a same layer.

Further, the organic functional layer further includes a hole blocking layer, and the hole blocking layer is disposed on the first light-emitting layer in the first pixel region, the second light-emitting layer in the second pixel region, and the third light-emitting layer in the third pixel region.

Further, the organic electroluminescent device further includes an electron injecting layer and an electron transporting layer disposed between the hole blocking layer and the cathode conductive layer, wherein the electron transport layer is disposed on the hole blocking layer, and the electron injection layer is disposed on the electron transport layer.

Further, the organic electroluminescent device further includes a hole injecting layer and a hole transporting layer disposed between the first electron blocking layer and the anode conductive layer, wherein the hole injection layer is disposed on the anode conductive layer, and the hole transport layer is disposed on the hole injection layer.

Further, each of the first electron blocking layer, the first light-emitting layer, the second electron blocking layer, and the second light-emitting layer is made of material having a hole transport rate greater than an electron transport rate.

Further, the first light-emitting layer, the second light-emitting layer, and the third light-emitting layer have different colors.

An embodiment of the invention further provides a display panel including an array substrate, an organic electroluminescent device and an encapsulation layer, wherein the organic electroluminescent device includes: an anode conductive layer; an organic functional layer disposed on the anode conductive layer; a cathode conductive layer disposed on the organic functional layer, wherein the organic functional layer includes a first pixel region, a second pixel region, and a third pixel region; and wherein the organic functional layer in the first pixel region includes a first electron blocking layer and a first light-emitting layer which are sequentially disposed on a side of the anode conductive layer adjacent to the cathode conductive layer, the organic functional layer in the second pixel region includes the first electron blocking layer, the first light-emitting layer, a second electron blocking layer, and a second light-emitting layer which are sequentially disposed on the side of the anode conductive layer adjacent to the cathode conductive layer, and the organic functional layer in the third pixel region includes the first electron blocking layer, the first light-emitting layer, the second electron blocking layer, the second light-emitting layer, a third electron blocking layer, and a third light-emitting layer which are sequentially disposed on the side of the anode conductive layer adjacent to the cathode conductive layer, and wherein the array substrate is disposed on a side of an anode conductive layer of the organic electroluminescent device, and the encapsulation layer is disposed on a side of a cathode conductive layer of the organic electroluminescent device.

Further, the second electron blocking layers in the second pixel region and the third pixel region are disposed in a same layer, and the second light-emitting layers in the second pixel region and the third pixel region are disposed in a same layer.

Further, the first electron blocking layers in the first pixel region, the second pixel region, and the third pixel region are disposed in a same layer, and the first light-emitting layers in the first pixel region, the second pixel region, and the third pixel region are disposed in a same layer.

Further, the organic functional layer further includes a hole blocking layer, and the hole blocking layer is disposed on the first light-emitting layer in the first pixel region, the second light-emitting layer in the second pixel region, and the third light-emitting layer in the third pixel region.

Further, the display panel further includes an electron injecting layer and an electron transporting layer between the hole blocking layer and the cathode conductive layer, the electron transport layer is disposed on the hole blocking layer, and the electron injection layer is disposed on the electron transport layer.

Further, the display panel further includes a hole injecting layer and a hole transporting layer between the first electron blocking layer and the anode conductive layer, the hole injection layer is disposed on the anode conductive layer, and the hole transport layer is disposed on the hole injection layer.

Further, each of the first electron blocking layer, the first light-emitting layer, the second electron blocking layer, and the second light-emitting layer is made of material having a hole transport rate greater than an electron transport rate.

Further, the first light-emitting layer, the second light-emitting layer, and the third light-emitting layer have different colors.

Further, the display panel according further includes a cover layer and a protective layer between the cathode conductive layer and the encapsulation layer, the cover layer is disposed on the cathode conductive layer, and the protective layer is disposed on the cover layer.

Beneficial effect of the present invention is that a first electron blocking layer and a first light-emitting layer are sequentially disposed in a first pixel region of an organic functional layer, and a first electron blocking layer, a first light-emitting layer, a second electron blocking layer, and a second light-emitting layer are sequentially disposed in the second pixel region of the organic functional layer, and the a first electron blocking layer, a first light-emitting layer, a second electron blocking layer, a second light-emitting layer, an electron blocking layer, and a third light-emitting layer are sequentially disposed in the third pixel region of the organic functional layer, wherein each of the second electron blocking layer and the third electron blocking layer in the second pixel region and the third pixel region is an integrally formed structure which is formed by using a semi-fine metal mask, to increase structural areas of the second electron blocking layer and the second light-emitting layer, thereby avoiding the use of a fine metal mask during preparation, thus reducing the defect rate of an organic electroluminescent device.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
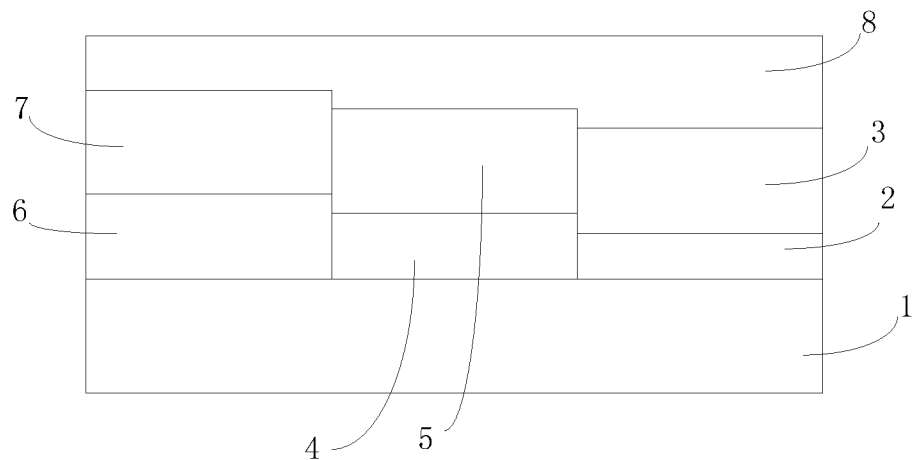
FIG. 1 is a schematic structural diagram of an organic electroluminescent device according to the prior art.

The preferred embodiments of the present invention are described below with reference to the accompanying drawings, which are used to exemplify the embodiments of the present invention, which can fully describe the technical contents of the present invention to make the technical content of the present invention clearer and easy to understand. However, the present invention may be embodied in many different forms of embodiments, and the scope of the present invention is not limited to the embodiments set forth herein.

The terms used in the description of the present invention are only used to describe specific embodiments, and it is not intended to show the concept of the invention. Expressions used in the singular encompasses the plural forms of expression unless the context clearly dictates otherwise. in the description of the present invention, it is to be understood that the terms such as "including", "having" and "containing", are intended to be illustrative of the possibilities of the features, the numbers, the steps, the acts, or combinations thereof disclosed in the present disclosure, and it is not intended to exclude the possibility that one or more other features, numbers, steps, acts, or combinations thereof may be added. The same reference numerals in the drawings denote the same parts.

Figure 2:
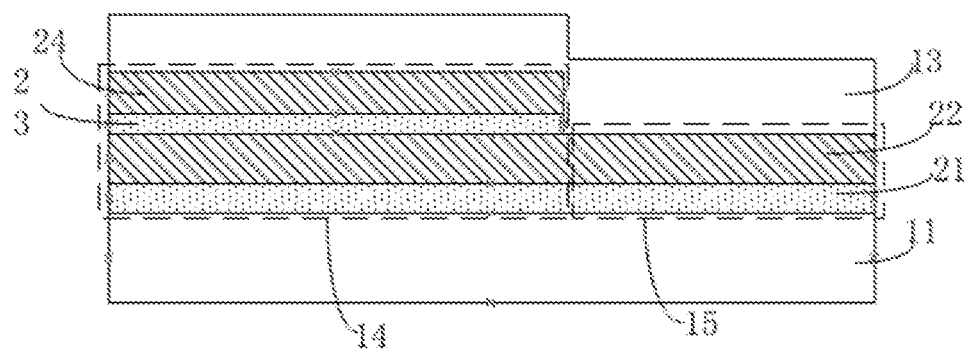
FIG. 2 is a schematic structural diagram of an organic electroluminescent device according to an embodiment of the present invention.

FIG. 2 is a schematic structural diagram of an organic electroluminescent device according to an embodiment of the present invention.

As shown in FIG. 2, the organic electroluminescent device provided in this embodiment includes an anode conductive layer 11, an organic functional layer, and a cathode conductive layer 13. The anode conductive layer 11 is a composite structure having both functions of conducting electricity and emitting light. The organic functional layer is disposed on the anode conductive layer 11, and the cathode conductive layer 13 is disposed on a side of the organic functional layer away from the anode conductive layer 11.

Specifically, as shown in FIG. 2, the organic functional layer includes a first pixel region 14 and a second pixel region 15, and a pixel unit corresponding to the first pixel region 14 and a pixel unit corresponding to the second pixel region 15 are different in color. The organic functional layer in the first pixel region 14 includes a first electron blocking layer 21 and a first light-emitting layer 22, wherein in the first pixel region 14, the first electron blocking layer 21 is disposed on the side of the anode conductive layer 11 adjacent to the cathode conductive layer 13, and the first light-emitting layer 22 is disposed on the side of the first electron blocking layer 21 away from the anode conductive layer 13. The organic functional layer in the second pixel region 15 includes a first electron blocking layer 21, a first light-emitting layer 22, a second electron blocking layer 23, and a second light-emitting layer 24, wherein in the second pixel region 15, the first electronic blocking layer 21 is disposed on a side of the anode conductive layer 11 adjacent to the cathode conductive layer 13, and the first light-emitting layer 22 is disposed on the side of the first electron blocking layer 21 away from the anode conductive layer 13, the second electron blocking layer 23 is disposed on the first light-emitting layer away from the electron blocking layer 22, and the second emitting layer 24 is disposed on the side of the second electron blocking layer 23 away from the first emitting layer 22.

In an embodiment, the organic electroluminescent device has pixel units of two colors, and the pixel units of the two colors correspond to the first pixel region 14 and the second pixel region 15, respectively. The first electron blocking layer 21 in the first pixel region 14 and the electron blocking layer 21 in the second pixel region 15 are disposed in the same layer, and are an integrally formed structure serving as the first electron blocking layer 21 of the organic functional layer together. The first light-emitting layer 22 in the first pixel region 14 and the first light-emitting layer 22 in the second pixel region 15 are disposed in the same layer, and is an integrally formed structure serving as the first light-emitting layer 22 of the organic functional layer together. Since the first electron blocking layer 21 and the first light-emitting layer 22 of the organic functional layer cover the first pixel region 14 and the second pixel region 15, a coverage area of the first electron blocking layer 21 and the first light-emitting layer 22 is increased, and thus the first electron blocking layer 21 of the organic functional layer can be deposited by evaporation in the first pixel region 14 and the second pixel region 15 simultaneously by using an open mask, and the first light-emitting layer 22 can be deposited by evaporation in the first pixel region 14 and the second pixel region 15 simultaneously by using an open mask, to reduce a number of uses of the fine metal mask, reduce difficulty of preparing the mask, and reduce the defect rate of the preparation of the organic electroluminescent device.

Figure 3:
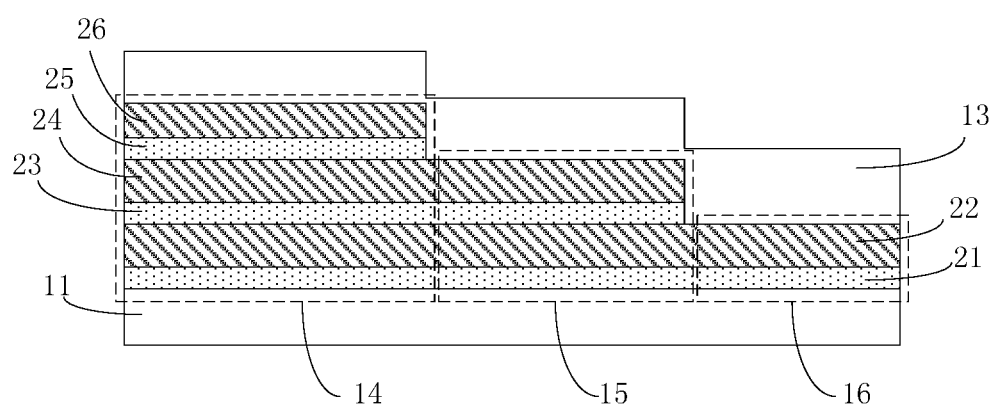
FIG. 3 is another schematic structural diagram of an organic electroluminescent device according to an embodiment of the present invention.

Further, as shown in FIG. 3, the organic functional layer further includes a third pixel region 16, and a pixel unit corresponding to the third pixel region 16 has a color different from the pixel unit corresponding to the first pixel region 14 and the pixel unit corresponding to the second pixel region 15. The organic functional layer in the third pixel region 16 includes a first electron blocking layer 21, a first light-emitting layer 22, a second electron blocking layer 23, a second light-emitting layer 24, a third electron blocking layer 25, and a third light-emitting layer 26. In the third pixel region 16, the first electron blocking layer 21 is disposed on the side of the anode conductive layer 11 adjacent to the cathode conductive layer 13, and the first light-emitting layer 22 is disposed on the side of the first electron blocking layer 21 away from the anode conductive layer 13. The second electron blocking layer 23 is disposed on the side of the first light-emitting layer 22 away from the first electron blocking layer 21, and the second light-emitting layer 24 is disposed on the side of the second electron blocking layer 23 away from the first light-emitting layer 22. a third electron blocking layer 25 is disposed on the side of the second light-emitting layer 24 away from the second electron blocking layer 23, and the third light-emitting layer 26 is disposed on the side of the third electron blocking layer 25 away from the second light-emitting layer 24.

In another embodiment, the organic electroluminescent device has pixel units of three colors, and the pixel units of the three colors correspond to the first pixel region 14, the second pixel region 15, and the third pixel region 16, respectively. The first electron blocking layer 21 in the first pixel region 14, the electron blocking layer 21 in the second pixel region 15, and the first electron blocking layer 21 in the third pixel region 16 are disposed in the same layer, and are an integrally formed structure, serving as the first electron blocking layer 21 of the organic functional layer together. The first light-emitting layer 22 in the first pixel region 14, the first light-emitting layer 22 in the second pixel region 15, and the first light-emitting layer 22 in the third pixel region 16 are disposed in the same layer, and are an integrally formed structure, serving as the first light-emitting layer 22 of the organic functional layer together. The second electron blocking layer 23 in the second pixel region 15 and the second electron blocking layer 23 in the third pixel region 16 are disposed in the same layer, and are an integrally formed structure, serving as the second electron blocking layer 23 of the organic functional layer together. The second light-emitting layer 24 in the second pixel region 15 and the second light-emitting layer 24 in the third pixel region 16 are disposed in the same layer, and are an integrally formed structure, serving as the second light-emitting layer 24 of the organic functional layer together.

Since the first electron blocking layer 21 and the first light-emitting layer 22 of the organic functional layer cover the first pixel region 14, the second pixel region 15, and the third pixel region 16, a coverage area of the first electron blocking layer 21 and the first light-emitting layer 22 is increased, and thus the first electron blocking layer 21 of the organic functional layer can be deposited by evaporation in the first pixel region 14, the second pixel region 15, and the third pixel region 16 simultaneously by using an open mask, and the first light-emitting layer 22 can be deposited by evaporation in the first pixel region 14, the second pixel region 15, and the third pixel region 16 simultaneously by using an open mask. Since the second electron blocking layer 23 and the second light-emitting layer 24 of the organic functional layer cover the second pixel region 15 and the third pixel region 16, a coverage area of the second electron blocking layer 23 and the second light-emitting layer 24 is increased, and thus the second electron blocking layer 23 and the second light-emitting layer 24 of the organic functional layer can be deposited by evaporation in the second pixel region 15 and the third pixel region 16 simultaneously by using a semi-fine metal mask, to reduce a number of uses of the fine metal mask, reduce difficulty of preparing the mask, and reduce the defect rate of the preparation of the organic electroluminescent device.

The first electron blocking layer 21 has a thickness of 30 to 70 Å, the first light-emitting layer 22 has a thickness of 100 to 300 Å, the second electron blocking layer 23 has a thickness of 100 to 300 Å, and the second light-emitting layer 24 has a thickness of 200-500 Å. The third electron blocking layer 25 is formed by vacuum evaporation, and the mask used is a fine metal mask (FMM) having a thickness of 100 to 300 Å. The third light-emitting layer 26 is formed by vacuum evaporation, and the mask used is a fine metal mask (FMM) having a thickness of 200 to 500 Å. The first light-emitting layer 22, the second light-emitting layer 24, and the third light-emitting layer 26 are light-emitting layers having different colors, and for example, the first light-emitting layer 22 is a blue light-emitting layer, the second light-emitting layer 24 is a green light-emitting layer, and the third light-emitting layer 26 is a red light-emitting layer, and these three light-emitting layers may also be other color light-emitting layers, which are not specifically limited herein.

Because in the second pixel region 15 and the third pixel region 16, the first electron blocking layer 21 and the first light-emitting layer 22 serve as the hole transport layers of the second electron blocking layer 23, the second light-emitting layer 24, the third electron blocking layer 25, and the third light-emitting layer 26, material of each of the first electron blocking layer 21 and the first light-emitting layer 22 has a hole transport rate greater than an electron transport rate, respectively. Similarly, since in the third pixel region 16, the second electron blocking layer 23 and the second light-emitting layer 24 serve as the hole transporting layers of the third electron blocking layer 25 and the third light-emitting layer 26, material of each of the second electron blocking layer 23 and the second light-emitting layer 24 has a hole transport rate greater than an electron transport rate.

Figure 4:
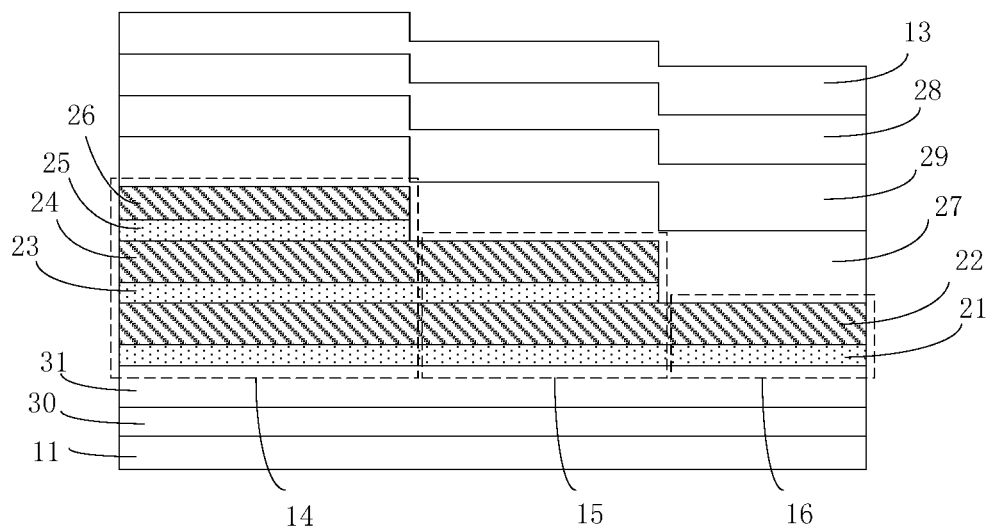
FIG. 4 is further another schematic structural diagram of an organic electroluminescent device according to an embodiment of the present invention.

Further, as shown in FIG. 4, the organic functional layer further includes a hole blocking layer 27, and the hole blocking layer 27 is disposed between the first light-emitting layer 22 in the first pixel region 14, the second light-emitting layer 24 in the second pixel region 15, and the third light-emitting layer 26 in the third pixel region 16 and the cathode conductive layer 13.

It should be noted that, the first electron blocking layer 21, the second electron blocking layer, and the third electron blocking layer 25 are respectively disposed on the sides of the first light-emitting layer 22, the second light-emitting layer 24, and the third light-emitting layer 26 in the organic functional layer close to the anode conductive layer 11, so that the first light-emitting layer 22, the second light-emitting layer 24, and the third light-emitting layer 26 in the organic functional layer are only powered to emit light in the portions that are in contact with the hole blocking layer 27, that is, only the first light-emitting layer 22 in the first pixel region 14, the second light-emitting layer 24 in the second pixel region 15, and the third light-emitting layer 26 in the third pixel region 16 are powered to emit light, so that no color mixing defect is generated between the pixel units.

The hole blocking layer 27 is fabricated by vacuum evaporation, and the mask used is an open mask having a thickness of 30 to 80 Å.

Further, as shown in FIG. 4, the organic functional layer further includes an electron injection layer 28 and an electron transport layer 29, wherein the electron injection layer 28 and the electron transport layer 29 are provided between the hole blocking layer 27 and the cathode conductive layers 13, the electron transport layer 29 is disposed on a side of the hole blocking layer 27 adjacent to the cathode conductive layer 13, and the electron injection layer 28 is disposed on the side of the electron transport layer 29 adjacent to the cathode conductive layer 13.

The electron transport layer 29 is fabricated by vacuum evaporation, and the mask used is an open mask having a thickness of 200 to 500 Å. The electron injecting layer 28 is formed by vacuum evaporation, and the mask used is an open mask having a thickness of 10 to 40 Å.

Further, as shown in FIG. 4, the organic functional layer further includes a hole injection layer 30 and a hole transport layer 31, and the hole injection layer 30 and the hole transport layer 31 are disposed between the first electron blocking layer 21 and the anode conductive layer 11, wherein the hole injection layer 30 is disposed on a side of the anode conductive layer 11 adjacent to the first electron blocking layer 21, and the hole transport layer 31 is disposed on a side of the hole injection layer 30 adjacent to the first electron blocking layer 21.

The hole injection layer 30 is formed by vacuum evaporation, and the mask used is an open mask having a thickness of 10 to 150 Å. The hole transport layer 31 is formed by vacuum evaporation, and the mask used is an open mask having a thickness of 1200 to 1500 Å.

It can be seen from the above that the organic electroluminescent device provided in this embodiment can sequentially dispose a first electron blocking layer and a first light-emitting layer in a first pixel region of an organic functional layer, and a first electron blocking layer, sequentially dispose a first light-emitting layer, a second electron blocking layer, and a second light-emitting layer in the second pixel region of the organic functional layer, and sequentially dispose the a first electron blocking layer, a first light-emitting layer, a second electron blocking layer, a second light-emitting layer, an electron blocking layer, and a third light-emitting layer in the third pixel region of the organic functional layer, wherein each of the second electron blocking layer and the third electron blocking layer in the second pixel region and the third pixel region is an integrally formed structure which is formed by using a semi-fine metal mask, to increase structural areas of the second electron blocking layer and the second light-emitting layer, thereby avoiding the use of a fine metal mask during preparation, thus reducing the defect rate of an organic electroluminescent device.

Figure 5:
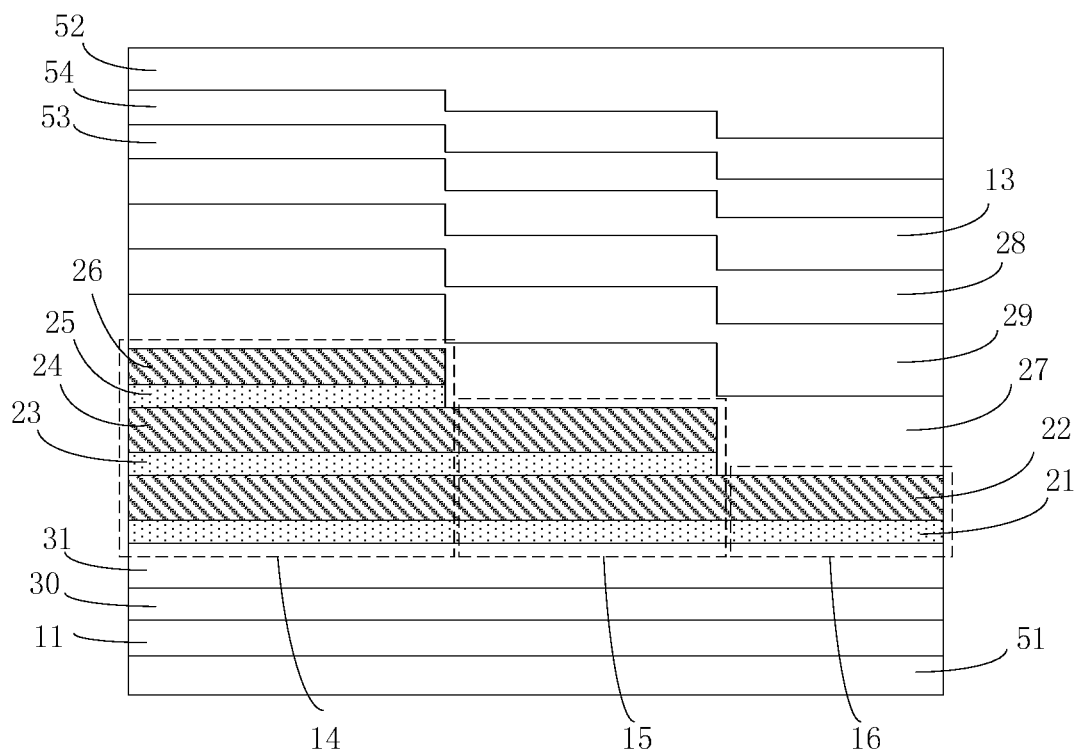
FIG. 5 is a schematic structural diagram of a display panel according to an embodiment of the present disclosure.

FIG. 5 is a schematic structural diagram of a display panel according to an embodiment of the present invention.

As shown in FIG. 5, the display panel includes an array substrate 51, an organic electroluminescent device, and an encapsulation layer 52. The organic electroluminescent device is the organic electroluminescent device in the above embodiments, and details are not repeated herein for brevity. The array substrate 51 is disposed on a side of the anode conductive layer 11 of the organic electroluminescent device, and the encapsulation layer 52 is disposed on a side of the cathode conductive layer 13 of the organic electroluminescent device.

Further, as shown in FIG. 5, a cover layer 53 and a protective layer 54 are further disposed between the cathode conductive layer 13 and the encapsulation layer 52. The cover layer 53 is disposed on the cathode conductive layer 13. The protective layer 54 is provided on the cover layer 53.

The cathode 13 is formed by vacuum evaporation, and the mask used is an open mask having a thickness of 100 to 300 Å. The cover layer 53 is formed by vacuum evaporation, and the mask used is an open mask having a thickness of 500 to 1500 Å. The protective layer 54 is formed by vacuum evaporation, and the mask used is an open mask having a thickness of 500 to 1500 Å. A microcavity structure is formed by layers between the cover layer 53 and the anode conductive layer 11, and a cavity length of the microcavity structure can change the wavelength of the emitted light. Therefore, for pixel units of different colors, the cavity lengths of their microcavity structures should be set to different. It should be understood that the hole blocking layer 27 in the vacuum evaporation process may be in direct contact with the first light-emitting layer 22 in the first pixel region 14, the second light-emitting layer 24 in the second pixel region 15, and the third pixel region 16 in the third light-emitting layer 26. Similarly, in the position of a same height, the hole blocking layer 27 and the encapsulating layer 52 and the layers therebetween are sequentially stacked to form a stepped arrangement.

Figure 6:
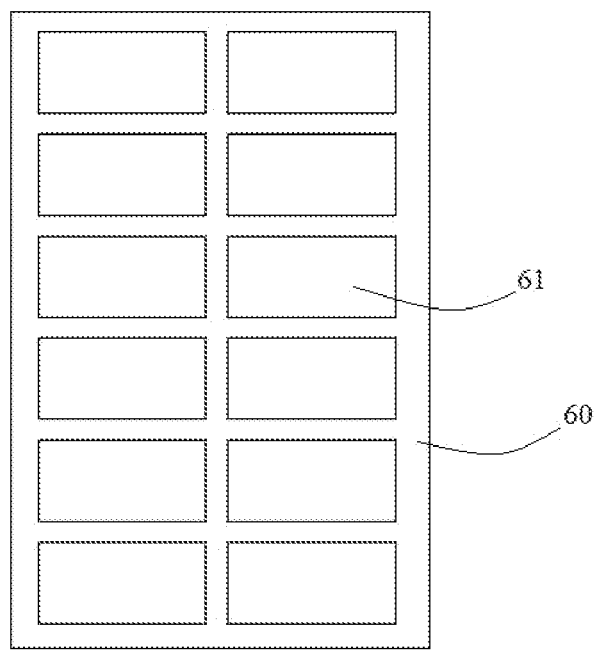
FIG. 6 is a schematic structural diagram of an open mask according to an embodiment of the present invention.
Figure 7:
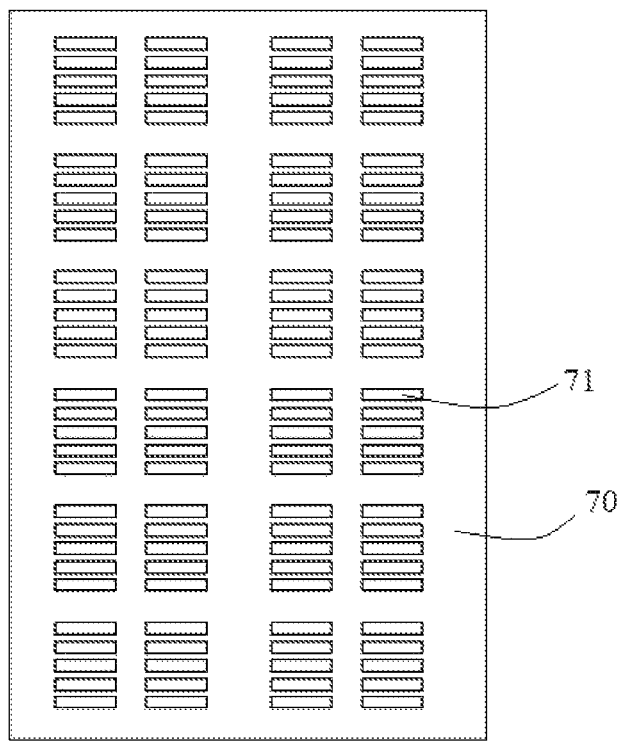
FIG. 7 is a schematic structural diagram of a semi-fine metal mask according to an embodiment of the present invention; FIG.
Figure 8:
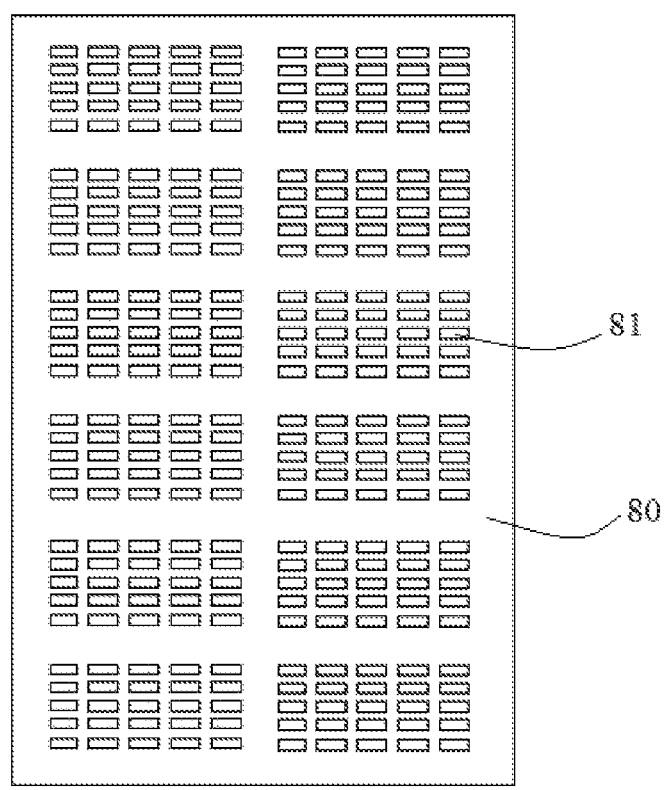
FIG. 8 is a schematic structural diagram of a fine metal mask according to an embodiment of the present invention.

In a specific embodiment, the display panel includes 12 rectangular effective display areas. As shown in FIG. 6, the open mask 60 has 12 open areas 61 corresponding to the 12 display areas of the display panel. During the fabrication process, the anode conductive layer 11 and the hole injection layer 30, the hole transport layer 31, the first electron blocking layer 21, the first light-emitting layer 22, the hole blocking layer 27, the electron transport layer 29, the electron injection layer 28, the cathode conductive layer 13, the cover layer 53, and the protective layer 54 are formed by using the open mask 60. As shown in FIG. 7, the semi-fine mask 70 has 10*12 open areas 71, and every 10 open areas 71 correspond to one display area of the display panel. In the fabrication process, the second electron blocking layer 23 and the second light-emitting layer 24 are formed using the semi-fine mask 70. As shown in FIG. 8, the fine metal mask 80 has 25*12 open areas 81, and every 25 open areas 81 correspond to one display area of the display panel. In the fabrication process, the third electron blocking layer 25 and the third light-emitting layer 26 are formed using the fine metal mask 80. The open mask and semi-fine mask are less difficult to make than the fine metal mask.

It should be noted that the display panel in this embodiment may be any display panel of an organic electroluminescent display or its component, such as an organic light-emitting diode panel, a quantum dot light-emitting display panel, an active matrix back panel, and a touch display, panel, and so on.

It can be seen from the above that the display panel provided in this embodiment can sequentially dispose a first electron blocking layer and a first light-emitting layer in a first pixel region of an organic functional layer, and a first electron blocking layer, sequentially dispose a first light-emitting layer, a second electron blocking layer, and a second light-emitting layer in the second pixel region of the organic functional layer, and sequentially dispose the a first electron blocking layer, a first light-emitting layer, a second electron blocking layer, a second light-emitting layer, an electron blocking layer, and a third light-emitting layer in the third pixel region of the organic functional layer, wherein each of the second electron blocking layer and the third electron blocking layer in the second pixel region and the third pixel region is an integrally formed structure which is formed by using a semi-fine metal mask, to increase structural areas of the second electron blocking layer and the second light-emitting layer, thereby avoiding the use of a fine metal mask during preparation, thus reducing the defect rate of an organic electroluminescent device.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic electroluminescent device, comprising:
an anode conductive layer;
an organic functional layer disposed on the anode conductive layer;
a cathode conductive layer disposed on the organic functional layer,
wherein the organic functional layer comprises a first pixel region, a second pixel region, and a third pixel region; and wherein the organic functional layer in the first pixel region comprises a first electron blocking layer and a first light-emitting layer which are sequentially disposed on a side of the anode conductive layer adjacent to the cathode conductive layer, the organic functional layer in the second pixel region comprises the first electron blocking layer, the first light-emitting layer, a second electron blocking layer, and a second light-emitting layer which are sequentially disposed on the side of the anode conductive layer adjacent to the cathode conductive layer, and the organic functional layer in the third pixel region comprises the first electron blocking layer, the first light-emitting layer, the second electron blocking layer, the second light-emitting layer, a third electron blocking layer, and a third light-emitting layer which are sequentially disposed on the side of the anode conductive layer adjacent to the cathode conductive layer.

2. The organic electroluminescent device according to claim 1, wherein the second electron blocking layers in the second pixel region and the third pixel region are disposed in a same layer, and the second light-emitting layers in the second pixel region and the third pixel region are disposed in a same layer.

3. The organic electroluminescent device according to claim 1, wherein the first electron blocking layers in the first pixel region, the second pixel region, and the third pixel region are disposed in a same layer, and the first light-emitting layers in the first pixel region, the second pixel region, and the third pixel region are disposed in a same layer.

4. The organic electroluminescent device according to claim 1, wherein the organic functional layer further comprises a hole blocking layer, and
the hole blocking layer is disposed on the first light-emitting layer in the first pixel region, the second light-emitting layer in the second pixel region, and the third light-emitting layer in the third pixel region.

5. The organic electroluminescent device according to claim 4, further comprising an electron injecting layer and an electron transporting layer disposed between the hole blocking layer and the cathode conductive layer,
wherein the electron transport layer is disposed on the hole blocking layer, and the electron injection layer is disposed on the electron transport layer.

6. The organic electroluminescent device according to claim 1, further comprising a hole injecting layer and a hole transporting layer disposed between the first electron blocking layer and the anode conductive layer,
wherein the hole injection layer is disposed on the anode conductive layer, and the hole transport layer is disposed on the hole injection layer.

7. The organic electroluminescent device according to claim 1, wherein each of the first electron blocking layer, the first light-emitting layer, the second electron blocking layer, and the second light-emitting layer is made of material having a hole transport rate greater than an electron transport rate.

8. The organic electroluminescent device according to claim 1, wherein the first light-emitting layer, the second light-emitting layer, and the third light-emitting layer have different colors.

9. A display panel, comprising an array substrate, an encapsulation layer, and an organic electroluminescent device, wherein the organic electroluminescent device comprises:
an anode conductive layer;
an organic functional layer disposed on the anode conductive layer;
a cathode conductive layer disposed on the organic functional layer,
wherein the organic functional layer comprises a first pixel region, a second pixel region, and a third pixel region; and wherein the organic functional layer in the first pixel region comprises a first electron blocking layer and a first light-emitting layer which are sequentially disposed on a side of the anode conductive layer adjacent to the cathode conductive layer, the organic functional layer in the second pixel region comprises the first electron blocking layer, the first light-emitting layer, a second electron blocking layer, and a second light-emitting layer which are sequentially disposed on the side of the anode conductive layer adjacent to the cathode conductive layer, and the organic functional layer in the third pixel region comprises the first electron blocking layer, the first light-emitting layer, the second electron blocking layer, the second light-emitting layer, a third electron blocking layer, and a third light-emitting layer which are sequentially disposed on the side of the anode conductive layer adjacent to the cathode conductive layer, and
wherein the array substrate is disposed on a side of an anode conductive layer of the organic electroluminescent device, and the encapsulation layer is disposed on a side of a cathode conductive layer of the organic electroluminescent device.

10. The display panel according to claim 9, wherein the second electron blocking layers in the second pixel region and the third pixel region are disposed in a same layer, and the second light-emitting layers in the second pixel region and the third pixel region are disposed in a same layer.

11. The display panel according to claim 9, wherein the first electron blocking layers in the first pixel region, the second pixel region, and the third pixel region are disposed in a same layer, and the first light-emitting layers in the first pixel region, the second pixel region, and the third pixel region are disposed in a same layer.

12. The display panel according to claim 9, wherein the organic functional layer further comprises a hole blocking layer, and
the hole blocking layer is disposed on the first light-emitting layer in the first pixel region, the second light-emitting layer in the second pixel region, and the third light-emitting layer in the third pixel region.

13. The display panel according to claim 12, further comprising an electron injecting layer and an electron transporting layer between the hole blocking layer and the cathode conductive layer,
the electron transport layer is disposed on the hole blocking layer, and the electron injection layer is disposed on the electron transport layer.

14. The display panel according to claim 9, further comprising a hole injecting layer and a hole transporting layer between the first electron blocking layer and the anode conductive layer,
the hole injection layer is disposed on the anode conductive layer, and the hole transport layer is disposed on the hole injection layer.

15. The display panel according to claim 9, wherein each of the first electron blocking layer, the first light-emitting layer, the second electron blocking layer, and the second light-emitting layer is made of material having a hole transport rate greater than an electron transport rate.

16. The display panel according to claim 9, wherein the first light-emitting layer, the second light-emitting layer, and the third light-emitting layer have different colors.

17. The display panel according to claim 9, further comprising a cover layer and a protective layer between the cathode conductive layer and the encapsulation layer,
the cover layer is disposed on the cathode conductive layer, and the protective layer is disposed on the cover layer.

* * * * *